United States Patent [19]

Caspari et al.

[11] Patent Number: 4,479,248
[45] Date of Patent: Oct. 23, 1984

[54] FREQUENCY SYNTHESIZED TUNING SYSTEM USING A MICROPROCESSOR

[75] Inventors: Frederick W. Caspari, South Bend; Bruce E. Smith; Daniel A. Heuer, both of Fort Wayne, all of Ind.

[73] Assignee: The Magnavox Company, New York, N.Y.

[21] Appl. No.: 422,330

[22] Filed: Sep. 23, 1982

Related U.S. Application Data

[63] Continuation of Ser. No. 183,867, Sep. 4, 1980, abandoned.

[51] Int. Cl.³ .............................................. H04B 1/26
[52] U.S. Cl. .................................. 455/183; 455/165; 455/186
[58] Field of Search ............... 455/164, 165, 169, 179, 455/181, 182, 183, 186, 158, 196, 197, 255, 257, 258, 260, 265; 358/191.1, 193.1, 195.1

[56] References Cited

U.S. PATENT DOCUMENTS

| | | | |
|---|---|---|---|
| 3,980,951 | 9/1976 | Breeze | 455/183 |
| 4,110,693 | 8/1978 | Evans | 455/183 |
| 4,142,162 | 10/1978 | Alberkrack | 455/183 |
| 4,220,922 | 9/1980 | Ikeguchi | 455/182 |
| 4,270,145 | 5/1981 | Farina | 455/183 |
| 4,280,140 | 7/1981 | Skerlos | 455/183 |
| 4,287,601 | 9/1981 | Borg | 455/186 |

OTHER PUBLICATIONS

Consider the Value-Added Benefits of μC Use in Consumer Products, by D. Bennett, Fairchild Semiconductor, EDN Mar. 5, 1979.

Primary Examiner—Tommy P. Chin
Attorney, Agent, or Firm—Thomas A. Briody; William J. Streeter; Edward W. Goodman

[57] ABSTRACT

A tuning system is provided in which the tuning function is substantially integrated in a microprocessor. A fixed modulus counter is cascaded with a programmable counter (or timer) found within the microprocesor thereby extending the counting range of the programmable counter. Then by prescaling the output of the local oscillator to a value below the toggle frequency of the microprocessor counter, the microprocessor may periodically measure the output frequency of the oscillator and, if necessary, generate correction signals therefor.

2 Claims, 5 Drawing Figures

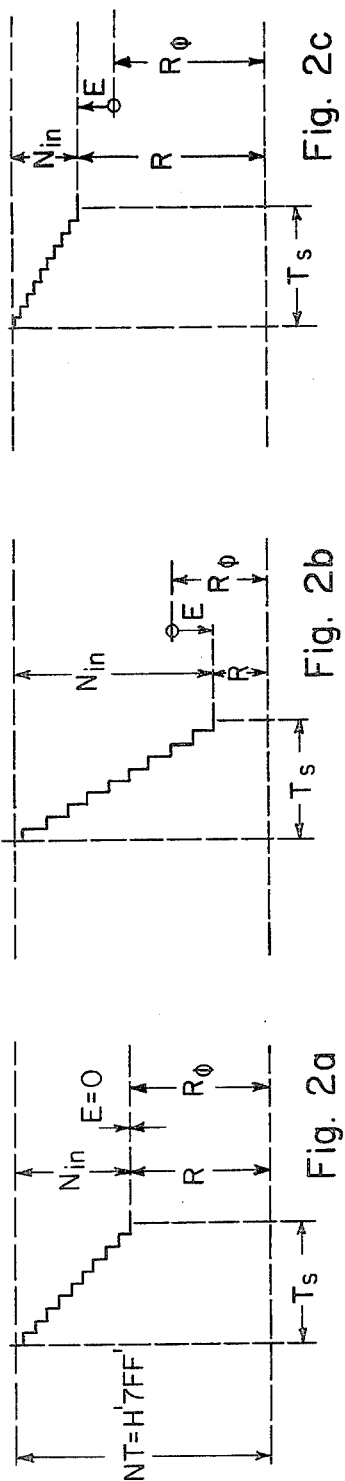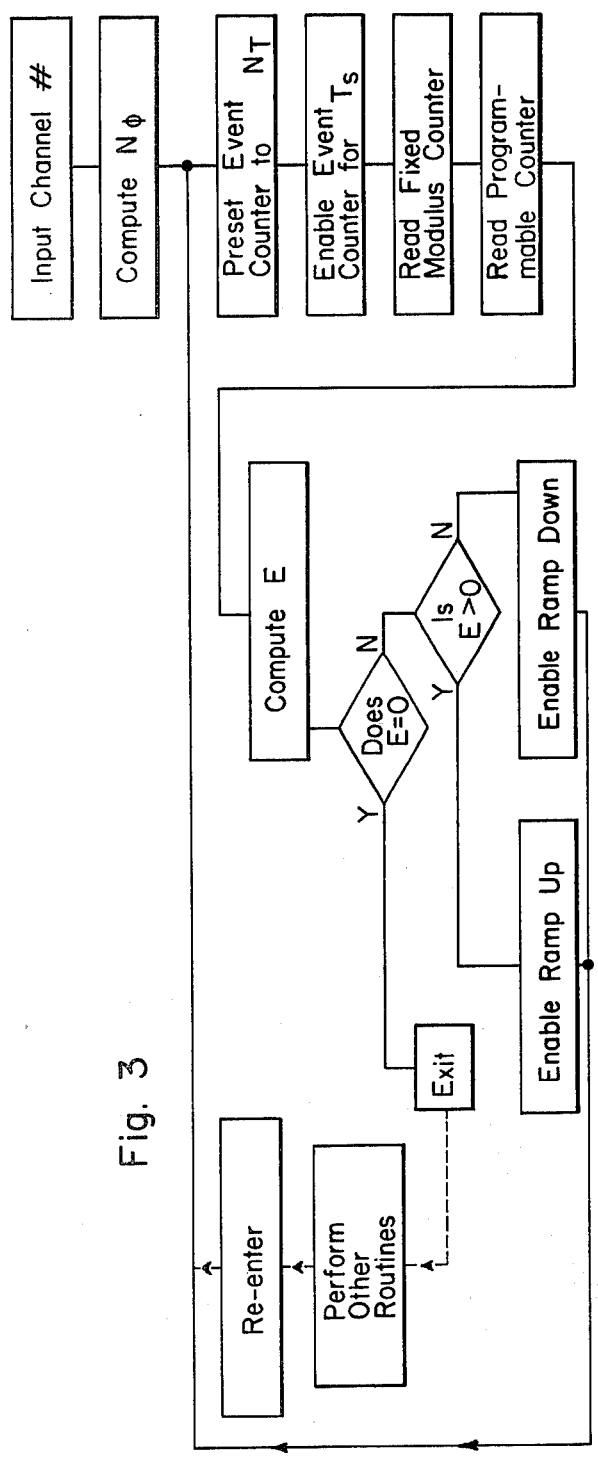

FREQUENCY SYNTHESIZED TUNING SYSTEM USING A MICROPROCESSOR

This is a continuation, of application Ser. No. 183,867, filed Sept. 4, 1980 now abandoned.

BACKGROUND OF THE INVENTION

This invention relates to tuning systems, and more particularly, to tuning systems for use in television receivers wherein microprocessors are used to implement the tuning function.

There are various microprocessor-aided tuning systems in use in which the microprocessor controls an external programmable divider or some other form of external loop synthesizer. An article entitled "Consider the Value-Added Benefits of µC Use in Consumer Products" by D. Bennett which appeared in EDN magazine, Mar. 5, 1979, pages 97–101, describes the different ways in which a microprocessor is presently used in tuning systems. The writer further suggests that a microcomputer may be used "as part of a frequencycounter network to check local oscillator frequencies". However, he does not indicate how this may be performed nor the extent of involvement of the microprocessor in controlling frequency.

SUMMARY OF THE INVENTION

The object of this invention is to provide a tuning system which uses a frequency synthesizer implemented with a microprocessor.

A further object of this invention is to provide a tuning system in which the tuning function occurs primarily within the microprocessor.

These objects are achieved in a frequency synthesized tuning system comprising a variable oscillator and a microprocessor coupled to said variable oscillator for the control thereof, said microprocessor having a programmable counter therein, wherein the tuning function of said tuning system is substantially integrated within said microprocessor, characterized in that said tuning system further comprises means coupled between said oscillator and said microprocessor for extending the capacity of said programmable counter, whereby said programmable counter may be used for measuring the output frequency of said variable oscillator.

DESCRIPTION OF THE DRAWINGS

With the above and additional objects and advantages in mind as will hereinafter appear, the invention will be described with reference to the accompanying drawings in which:

FIGS. 2a, 2b and 2c show a series of graphs illustrating various counter states versus time; and FIG. 3 shows the tuning routine executed by the microprocessor.

DESCRIPTION OF THE PREFERRED EMBODIMENT

Figure 1:
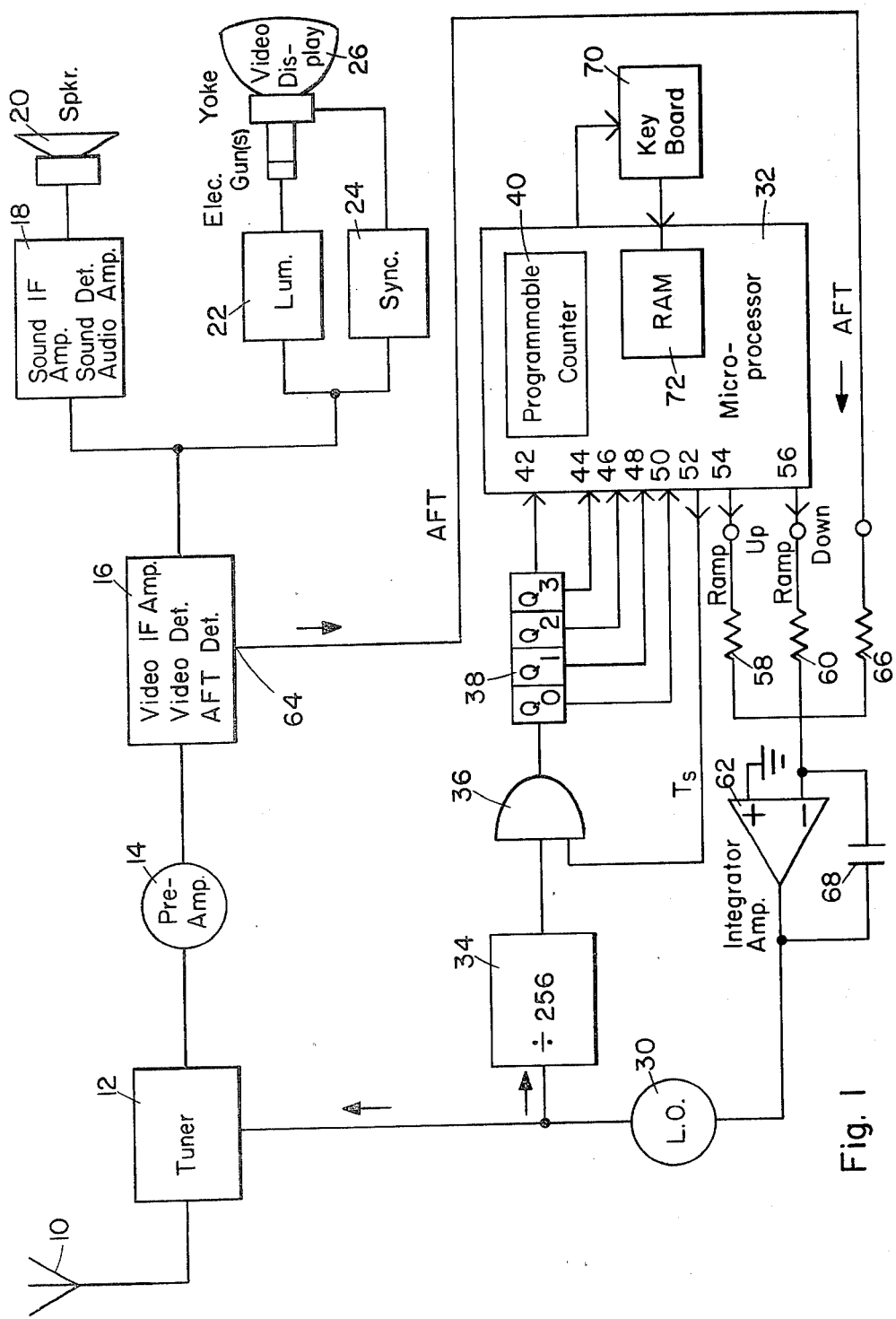
FIG. 1 shows, in block diagram, a television receiver having incorporated therein the tuning system of this invention.

In order to achieve adequate tuning resolution using primarily a microprocessor, it is necessary to increase the capacity of the programmable counter contained therein. As will be explained further on, this is done by cascading the programmable counter with an external counter thereby extending the capacity of the programmable counter. This extended counter acts as an event counter, that is, it accumulates in a given time, $T_s$, a quantity of inputs, or events, $N_{IN}$.

Frequency is defined as the number of events occurring in a unit of time. This definition leads to a method of frequency counting. In this case, the unknown frequency, $f_{IN}$, is gated for a specified period of time, $T_s$, generating a quantity of pulses, $N_{IN}$, which are counted and stored in the event counter. This relationship may be expressed as follows:

$$f_{IN} = (N_{IN}/T_s) \quad (1)$$

If $f_{IN}$ were to be taken directly from the local oscillator and $T_s$ was set to equal one microsecond, then NIN would be the magnitude, in megahertz, of $f_{IN}$. This direct approach is not however possible since the local oscillator frequency exceeds the maximum toggle frequency of the event counter. To this end, the local oscillator frequency is prescaled by 256 and the output therefrom is gated to the event counter. The input to the event counter may then be expressed as follows:

$$f_{IN} = (f_0/256) \quad (2)$$

where $f_0$ is the frequency of the local oscillator. By substitution, equation (1) then becomes:

$$(f_0/256) = (N_{IN}/T_s) \quad (3)$$

Solving then for $N_{IN}$:

$$N_{IN} = f_0 (T_s/256) \quad (4)$$

If $T_s$ is chosen to be 256 microseconds $$N_{IN} = f_0 \quad (5)$$

Thus, if $T_s = 256$ microseconds, the number of bits accumulated by the event counter is equal to the local oscillator frequency in megahertz. This equates to a "bit sensitivity" of 1 bit/MHz, which means that resolution is limited to one megahertz. This is not adequate since in most receivers, in order to bring the local oscillator frequency within the pull-in range of the automatic fine tuning (AFT) loop, the system must resolve to within 0.5 megahertz. This requires a bit sensitivity of 1 bit/0.5 MHz, or 2 bits/MHz. At this rate, the number of bits (or pulses) accumulated by the counter, during a period $T_s$, equals twice the local oscillator frequency in MHz.

$$N_{IN} = 2f_0 \quad (6)$$

This increased resolution is obtained by doubling the sampling time, $T_s$, as follows:
From equation (4)

$$N_{IN} = f_0 (T_s/256) \quad (4)$$

subsituting equation (6):

$$2f_0 = f_0 (T_s/256) \quad (7)$$

Solving for $T_s$ $$T_s = 2(256) = 512 \text{ microseconds}$$

It should be noted that the counter capacity is dependent upon the desired resolution. The maximum number of bits to be counted is the product of the resolution and the highest frequency to be received. Therefore:

$$(2 \text{ bits/MHz}) \times (931 \text{ MHz}) = 1862 \text{ bits}$$

wherein 931 MHz is the frequency of channel 83 in the UHF band. Hence an 11-bit counter is required since $2^{11} = 2048$ bits.

Referring to FIG. 1, a practical embodiment of the invention is shown incorporated in a television receiver. A transmitted television signal is received by an antenna 10 and is passed along to a TV tuner 12. After suitable processing in the tuner 12, the desired video signal is fed, through a preamplifier 14, to a stage 16 comprising a video detector, an IF amplifier and an AFT detector. An output from the stage 16 carrying the video signal is then applied, on the one hand, to a stage 18 having an IF amplifier, sound detector and audio amplifier, which generates signals for driving a loudspeaker 20, and, on the other hand, to a luminance circuit 22 and to a synchronization circuit 24 for activating a video display 26.

In order to tune to a desired transmitter frequency, the receiver includes a variable oscillator 30 having the output thereof connected to the tuner 12. A microprocessor 32 is used to control the oscillator 30 and is contained in a feedback loop between the output of the oscillator 30 and a control input thereof. The feedback loop includes a fixed divider 34 connected to the output of the oscillator 30 for prescaling the frequency therefrom by 256. The output of the divider 34 is applied to one input of an AND gate 36 whose output is applied to a fixed modulus external counter 38. This external counter 38 is cascaded with a programmable counter 40, contained within the microprocessor 32, through an input 42, forming an event counter. The external counter 38 in this case is a four-bit counter having the bits $Q_0$, $Q_1$, $Q_2$ and $Q_3$ connected respectively to microprocessor 32 inputs 44, 46, 48 and 50 for periodic reading thereof by the microprocessor 32. An output 52 of the microprocessor 32 is connected to a second input of the AND-gate 36. The output 52 provides a periodic gating signal $T_s$ to the gate 36 allowing the output from the divider 34 to be counted by the event counter 38, 40 for a fixed period of time (512 μS).

The microprocessor 32 further includes two outputs 54 and 56 for selectively providing one of two variable width pulses, termed ramp-up and ramp-down, respectively. The ramp-up output 54 is enabled when the oscillator 30 frequency, the determination of which is to be explained, is lower than the desired frequency, while the ramp-down output 56 is enabled when the oscillator 30 frequency is higher than the desired frequency. The outputs 54 and 56 are connected through a pair of resistors 58 and 60, respectively, to the inverting input of an integrating amplifier 62, the non-inverting input thereto being connected to ground. An AFT signal, originating from an output 64 of the stage 16, is also applied to the inverting input through a resistor 66. A capacitor 68 couples the inverting input of the amplifier 62 to the output thereof which in turn is connected to the control input of the variable oscillator 30.

The tuner routine performed by the microprocessor 32 has for an object to generate an error command E which is proportional to the difference between the desired and the present oscillator 30 frequency. FIGS. 2a, 2b, 2c show the event counter state versus time for various oscillator 30 frequencies. Initially, the event counter 38, 40 is loaded with a maximum number $N_T$, for example hexadecimal 7FF, which equals 2047. The microprocessor 32 then initiates the signal $T_s$ on the output 52 which enables the gate 36 allowing the event counter 38, 40 to count down, from $N_T$, the pulses from the divider 34 for the duration of the signal $T_s$. As shown in the FIGS. 2a, 2b, 2c, the present state of the event counter 38, 40 is represented by R, which is related to $N_{IN}$ as follows:

$$R = N_T - N_{IN} \tag{8}$$

If $N_\phi$ is the equivalent of the desired frequency, then $$R_\phi = N_T - N_\phi \tag{9}$$

The error command E is therefore defined as $$E = R - R_\phi \tag{10}$$

Referring to FIG. 2a, R is equal to $R_\phi$ and therefore, E=0, signifying that the frequency $F_0$ of the oscillator 30 is equal to the desired frequency $F_\phi$, within the resolution of the routine. In FIG. 2b, R is less than $R_\phi$ giving E a negative value. The frequency $F_0$ of the oscillator 30 is therefore too high. Conversely, in FIG. 2c, R is greater than $R_\phi$ giving E a positive value, showing that the frequency $F_0$ of the oscillator 30 is too low.

The error command E is then converted to the ramp-up or ramp-down pulses, wherein, when E is positive the ramp-up pulse is applied to the output 54, while, when E is negative the ramp-down pulse is applied to the output 56. It should be noted that the width of the ramp-up and ramp-down pulses are proportional to the magnitude of E.

FIG. 3 shows the actual routine performed by the microprocessor 32. As shown therein, the first step is to input the value $N_\phi$ which is equivalent to the desired frequency $F_\phi$. There are numerous ways in which this may be performed. In the preferred embodiment shown in FIG. 1, a keyboard 70 is connected to the microprocessor 32 and couples with a RAM 72 contained therein. This keyboard 70 may be scanned in the manner typical to most hand-held calculators, with the channel number entered thereon being stored in the RAM 72. The value of $N_\phi$ may then be calculated and stored using the following equation:

$$N_\phi = k_1 + 12 N_c \tag{11}$$

where $N_c$ is the channel number and $k_1$ is a constant which is specified by the selected band, for example, $k_1 = 866$ for UHF and $k_1 = 358$ for channels 7-13.

In the routine of FIG. 3, the microprocessor 32 must calculate the value of the error command E. The solution to equation 10 may be obtained by the following procedure which adds $(-R_\phi)$ to R.

Starting with equation (9)

$$R_\phi = N_T - N_\phi \tag{9}$$

$$-R_\phi = N_\phi - N_T \tag{12}$$

Since $N_T$ is set to H"7FF", $(-N_T)$ is equal to H"801". However, if the calculation for E is limited to 11 bits, only the lower three bits of the higher order byte are used and therefore, the "8" in H"801" may be discarded. Thus $(-N_T)$ equals H"001" and $$-R_\phi = N_\phi + 1 \tag{13}$$

$$E = R + (N_\phi + 1) \tag{14}$$

As shown in FIG. 3, so long as E does not equal 0 the tuning routine is looped continuously. However, when E does equal 0, the microprocessor 32 is allowed to exit the tuning routine and may then perform other routines, for example, remote control decoding, channel display, etc., at the end of which the microprocessor 32 may re-enter the tuning routine.

If the sampling time, $T_s$ is kept less than, or equal to, 512 microseconds, it is also possible to perform the above-described routine within the vertical retrace interval which occurs between the scanning of each field of video information in a television receiver. Thus any radio frequency interference (RFI) generated by the operation of this routine will not have any effect on the displayed picture.

This may also be extended to other RFI generating routines, such as keyboard scanning, wherein the sampling time is made less than 512 microseconds, provided that the execution time of the routine is constant.

Numerous alterations of the structure herein disclosed will suggest themselves to those skilled in the art. However, it is to be understood that the present disclosure relates to a preferred embodiment of the invention which is for the purpose of illustration only and not to be construed as a limitation of the invention. All such modifications which do not depart from the spirit of the invention are intended to be included within the scope of the appended claims.

We claim:

1. A frequency synthesized tuning system for tuning to a preselected frequency comprising a variable oscillator and a microprocessor coupled to said variable oscillator for the control thereof, said microprocessor having a programmable counter therein, characterized in that said tuning system further comprises a fixed divider for receiving an output signal from said variable oscillator, a fixed modulus counter cascaded with said programmable counter for extending the range thereof, and gating means connected between said fixed divider and said fixed modulus counter for allowing the application of the output from said divider to said fixed modulus counter for a specified period of time, whereby said programmable counter along with said fixed divider, said gating means and said fixed modulus counter in effect measures the frequency of the output signal of said variable oscillator such that said microprocessor may then compare the frequency of said oscillator output signal with said preselected frequency and then, based on said comparison, generate a correction signal for said oscillator thereby effecting the tuning function of said tuning system substantially within said microprocessor.

2. A frequency synthesized tuning system as set forth in claim 1, wherein said tuning system further comprises integrating means coupling the output of said microprocessor to said variable oscillator.

* * * * *